(12) United States Patent
Kang et al.

(10) Patent No.: US 9,627,548 B2
(45) Date of Patent: Apr. 18, 2017

(54) THIN FILM TRANSISTOR ARRAY PANEL AND METHOD OF MANUFACTURING THE SAME

(71) Applicant: Samsung Display Co., Ltd., Yongin-si, Gyeonggi-Do (KR)

(72) Inventors: Hyun Ju Kang, Pocheon-si (KR); Dong Hee Lee, Hwaseong-si (KR); Gwang Min Cha, Cheongju-si (KR); Sang Won Shin, Yongin-si (KR); Sang Woo Sohn, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/841,559

(22) Filed: Aug. 31, 2015

(65) Prior Publication Data

US 2016/0197192 A1 Jul. 7, 2016

(30) Foreign Application Priority Data

Jan. 2, 2015 (KR) .................. 10-2015-0000226

(51) Int. Cl.
*H01L 29/786* (2006.01)
*H01L 29/66* (2006.01)
*H01L 29/423* (2006.01)
*H01L 29/45* (2006.01)
*H01L 27/12* (2006.01)

(52) U.S. Cl.
CPC ...... *H01L 29/7869* (2013.01); *H01L 27/1225* (2013.01); *H01L 29/42384* (2013.01); *H01L 29/45* (2013.01); *H01L 29/66969* (2013.01)

(58) Field of Classification Search
CPC ............ H01L 27/1237; H01L 27/1251; H01L 29/41733; H01L 29/42384; H01L 29/45; H01L 29/458; H01L 29/4908; H01L 29/66765; H01L 29/78678; H01L 29/7869
See application file for complete search history.

(56) References Cited

U.S. PATENT DOCUMENTS

2004/0263746 A1* 12/2004 Cho ................ G02F 1/13439
349/139
2013/0299817 A1* 11/2013 Park .................. H01L 29/45
257/43
2014/0131702 A1 5/2014 Matsubayashi et al.

FOREIGN PATENT DOCUMENTS

KR 1020060110927 A 10/2006
KR 100939560 1/2010
(Continued)

*Primary Examiner* — Pamela E Perkins
(74) *Attorney, Agent, or Firm* — Robert E. Bushnell, Esq.

(57) ABSTRACT

A thin film transistor array panel that includes: a substrate; a gate electrode disposed on the substrate; a semiconductor layer disposed on the substrate; a gate insulating layer disposed between the gate electrode and the semiconductor layer; a source electrode disposed on the semiconductor layer and a drain electrode facing the source electrode; a metal oxide layer covering the source electrode and the drain electrode; and a passivation layer covering the source electrode, the drain electrode, and the metal oxide layer, wherein the source electrode and the drain electrode include a first material and a second material which is added to the first material and metal included in the metal oxide layer is formed by diffusing the second material.

13 Claims, 24 Drawing Sheets

(56) References Cited

FOREIGN PATENT DOCUMENTS

KR          101146486     *   5/2012
KR    1020130052654 A    5/2013

\* cited by examiner

THIN FILM TRANSISTOR ARRAY PANEL AND METHOD OF MANUFACTURING THE SAME

CLAIM PRIORITY

This application claims priority to and the benefit of Korean Patent Application No. 10-2015-0000226 filed in the Korean Intellectual Property Office on Jan. 2, 2015, the entire contents of which are incorporated herein by reference.

BACKGROUND

1. Field of Invention

The present invention generally relates to a thin film transistor array panel and a method of manufacturing the same.

2. Description of the Related Art

Generally, display devices such as a liquid crystal display and an organic light emitting diode display include a plural pairs of field generating electrodes and an electro-optical active layer interposed therebetween. The liquid crystal display includes a liquid crystal layer as the electro-optical active layer and the organic light emitting diode display includes an organic emission layer as the electro-optical active layer.

One of the pair of field generating electrodes is generally connected to a switching element to receive an electrical signal and the electro-optical active layer converts the electrical signal into an optical signal, thereby displaying an image.

The display device uses a thin film transistor (TFT) which is a three terminal element as the switching device and includes signal lines, such as a gate line which transfers a scanning signal for controlling the thin film transistor and a data line for transferring a signal to be applied to a pixel electrode.

Meanwhile, as an area of the display device is increased, an oxide semiconductor technology for realizing high speed driving has been researched and a method for reducing resistance of the signal line has been researched. In particular, to reduce the resistance of the signal line, a main wiring layer may be made of materials such as copper or copper alloy. In this case, porous metal oxide is formed between the main wiring layer and a passivation layer covering the main wiring layer and thus reliability of a device may be reduced.

The above information disclosed in this Related Art section is only for enhancement of understanding of the background of the invention and therefore it may contain information that does not form the prior art that is already known in this country to a person of ordinary skill in the art.

SUMMARY

The present invention has been made in an effort to provide a thin film transistor array panel and a method of manufacturing the same having advantages of preventing porous metal oxide from being formed between a main wiring layer and a passivation layer.

An exemplary embodiment of the present invention provides a thin film transistor array panel including: a substrate; a gate electrode disposed on the substrate; a semiconductor layer disposed on the substrate; a gate insulating layer disposed between the gate electrode and the semiconductor layer; a source electrode disposed on the semiconductor layer and a drain electrode facing the source electrode; a metal oxide layer covering the source electrode and the drain electrode; and a passivation layer covering the source electrode, the drain electrode, and the metal oxide layer, wherein the source electrode and the drain electrode include a first material and a second material which is added to the first material and metal included in the metal oxide layer is formed by diffusing the second material.

The thin film transistor array panel may further include: a diffusion metal layer disposed between the source electrode and the metal oxide layer and between the drain electrode and the metal oxide layer.

The source electrode and the drain electrode may include copper or copper alloy.

The second material may include at least one of Mn, Mg, Al, Mo, W, Ti, Ga, In, Ni, La, Nd, Sn, Ag, Cr, Zr, Zn, and Fe.

The thin film transistor array panel may further include: barrier layers disposed under the source electrode and the drain electrode, the barrier layer including metal oxide.

The barrier layer may include one of indium-zinc oxide (IZO), gallium-zinc oxide (GZO), and aluminum-zinc oxide (AZO).

The metal oxide layer may cover upper surfaces and lateral walls of the source electrode and the drain electrode, respectively.

The passivation layer may contact the upper surface and the lateral wall of the metal oxide layer.

The thin film transistor array panel may further include: barrier layers disposed under the source electrode and the drain electrode; and capping layers disposed over the source electrode and the drain electrode, the barrier layer and the capping layer including metal oxide.

Lateral walls of the source electrode and the drain electrode, respectively, which are adjacent to a channel region of the semiconductor layer may be exposed and the exposed lateral wall of the source electrode and the exposed lateral wall of the drain electrode may be covered with the metal oxide layer.

The semiconductor layer may include oxide semiconductor.

The lateral wall of the semiconductor layer may be aligned like the lateral walls of the source electrode and the drain electrode, except for the channel region.

Another embodiment of the present invention provides a method for manufacturing a thin film transistor array panel including: forming a gate electrode on a substrate; forming a semiconductor layer on the substrate; forming a gate insulating layer between the gate electrode and the semiconductor layer; forming a source electrode disposed on the semiconductor layer and a drain electrode facing the source electrode; annealing the source electrode and the drain electrode; forming a metal oxide layer covering the source electrode and the drain electrode; and forming a passivation layer covering the source electrode, the drain electrode, and the metal oxide layer, wherein the annealing includes diffusing an alloyed material to surfaces of the source electrode and the drain electrode.

The forming of the metal oxide layer may include performing nitrogen oxide plasma treating.

In the annealing, the diffusion metal layer may be formed between the source electrode and the metal oxide layer and between the drain electrode and the metal oxide layer and the diffusion metal layer may include the alloyed material in the source electrode and the drain electrode.

The method may further include: prior to the forming of the source electrode and the drain electrode, forming a barrier layer on the semiconductor layer, wherein the barrier layer is formed to include the metal oxide.

The metal oxide layer may be formed to cover upper surfaces and lateral walls of the source electrode and the drain electrode, respectively.

The method may further include: prior to the forming of the source electrode and the drain electrode, forming a barrier layer on the semiconductor layer; and forming capping layers on the source electrode and the drain electrode, wherein the barrier layer and the capping layer are formed to include the metal oxide.

The semiconductor layer may be formed to include oxide semiconductor.

The forming of the semiconductor layer and the forming of the source electrode and the drain electrode may be simultaneously performed using one mask.

According to an exemplary embodiment of the present invention, it is possible to improve the reliability by suppressing the materials forming the main wiring layer from being oxidized by forming the metal oxide layer between the main wiring layer and the passivation layer. Further, according to an exemplary embodiment of the present invention, it is possible to reduce the process costs by removing the capping layer which is formed on the main wiring layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1:
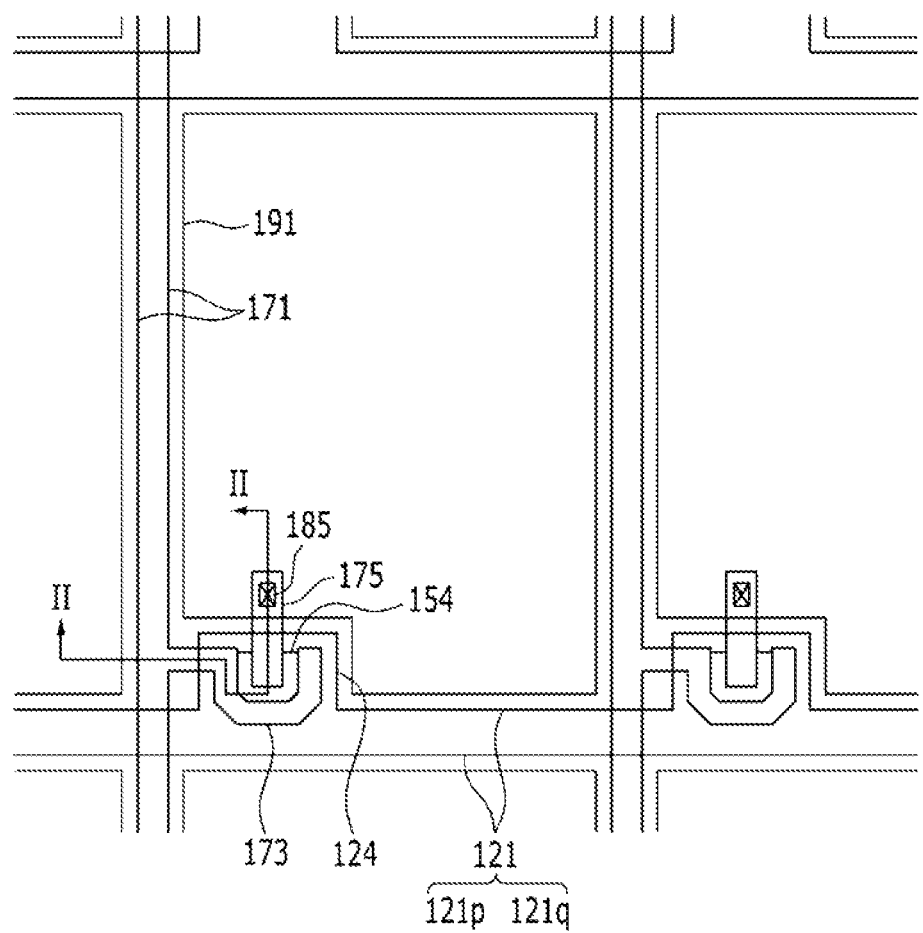
FIG. 1 is a plan view illustrating a thin film transistor array panel according to an exemplary embodiment of the present invention.

Hereinafter, exemplary embodiments of the present invention will be described in detail with reference to the accompanying drawings. However, the present invention is not limited to the exemplary embodiments set forth herein but may be modified in many different forms. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. Further, it will be understood that when a layer is referred to as being "on" another layer or substrate, it can be directly on the other layer or substrate, or intervening them may also be present. Like reference numerals designate like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
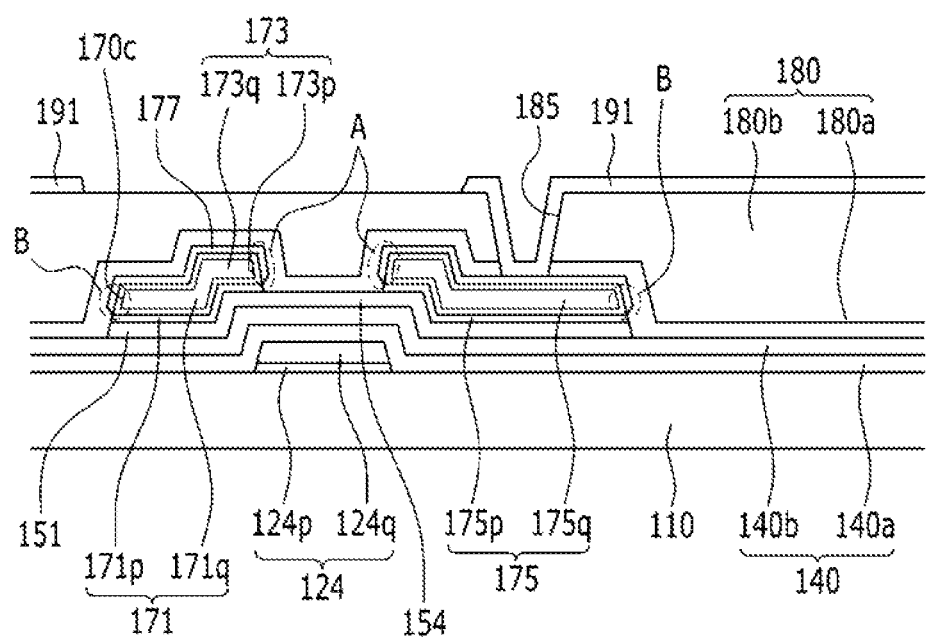
FIG. 2 is a cross-sectional view taken along the line II-II of FIG. 1.

FIG. 1 is a plan view illustrating a thin film transistor array panel according to an exemplary embodiment of the present invention. FIG. 2 is a cross-sectional view taken along the line II-II of FIG. 1.

Referring to FIGS. 1 and 2, a thin film transistor array panel 100 according to an exemplary embodiment of the present invention includes a plurality of gate lines 121 which are formed on an insulating substrate 110 made of transparent glass, plastic, or the like.

The gate lines 121 transfers gate signals and mainly extend in a horizontal direction. Each gate line 121 includes a plurality of gate electrodes 124 which protrude from the gate lines 121.

The gate line 121 and the gate electrode 124 may have a double layer structure which is configured of first layers 121p and 124p and second layers 121q and 124q. The first layers 121p and 124p and the second layers 121q and 124q each may be made of aluminum-based metals such as aluminum (Al) and aluminum alloy, silver-based metals such as silver (Ag) and silver alloy, copper-based metals such as copper (Cu) and copper alloy, molybdenum-based metals such as molybdenum (Mo) and molybdenum alloy, chromium (Cr), titanium (Ti), tantalum (Ta), manganese (Mn), and the like. For example, the first layers 121p and 124p may include titanium and the second layers 121q and 124q may include copper or copper alloy.

The first layers 121p and 124p and the second layers 121q and 124q may be formed by combining layers having different physical properties. The exemplary embodiment of the present invention describes that the gate line 121 and gate electrode 124 are formed in the double layer but is not limited thereto, and therefore the gate line 121 and gate electrode 124 may be formed in a single layer form or a triple layer form.

A gate insulating layer 140 which is made of insulating materials such as silicon oxide or silicon nitride is disposed on the gate line 121. The gate insulating layer 140 may include a first insulating layer 140a and a second insulating layer 140b. The first insulating layer 140a may be made of silicon nitride (SiNx) having a thickness of approximately 4000 Å and the second insulating layer may be made of silicon oxide (SiOx) having a thickness of approximately 500 Å. According to another exemplary embodiment of the present invention, the first insulating layer 140a may be made of silicon oxinitride (SiON) and the second insulating layer 140b may be made of silicon oxide (SiOx). The exemplary embodiment of the present invention describes that the gate insulating layers 140a and 140b are formed in a double layer form, the gate insulating layers 140a and 140b may be formed in a single layer form.

A semiconductor layer 151 is formed on the gate insulating layer 140. The semiconductor layer 151 may be made of amorphous silicon, crystalline silicon, or oxide semiconductor. The semiconductor layer 151 mainly extends in a vertical direction and includes a plurality projections (154) which extend toward the gate electrode 124.

When the semiconductor layer 151 is made of the oxide semiconductor, the semiconductor layer 151 includes at least one of zinc (Zn), indium (In), tin (Sn), gallium (Ga), and hafnium (Hf). In particular, according to the exemplary embodiment of the present invention, the semiconductor layer 151 may be made of indium-gallium-zinc oxide.

A data wiring layer which includes a plurality of data lines 171 and a plurality of source electrodes 173 and a plurality of drain electrodes 175 which are connected to the data lines 171 is formed on the semiconductor layer 151 and the gate insulating layer 140.

The data lines 171 transfer the data signals and mainly extend in a vertical direction to intersect the gate lines 121. The source electrode 173 extends from the data line 171 to overlap the gate electrode 124 and may have substantially an U-letter shape. However, a structure of the source electrode 173 and the drain electrode 175 may be modified.

The drain electrode 175 is separated from the data line 171 and extends upward from a center of the U-letter shape of the source electrode 173.

The data line 171, the source electrode 173, and the drain electrode 175 have a double layer structure of barrier layers 171p, 173p, and 175p and main wiring layers 171q, 173q, and 175q. The barrier layers 171p, 173p, and 175p are made of metal oxide. In detail, the barrier layers 171p, 173p, and 175p may be made of one of indium-zinc oxide, gallium-zinc oxide, and aluminum-zinc oxide. The barrier layers 171p, 173p, and 175p serve a diffusion preventing layer which prevents materials such as copper from being diffused to the semiconductor layer 151.

The main wiring layers 171q, 173q, and 175q include a first material and a second material added thereto. For example, the first material may be copper and the second material may include at least one of Mn, Mg, Al, Mo, W, Ti, Ga, In, Ni, La, Nd, Sn, Ag, Cr, Zr, Zn, and Fe. The main wiring layers 171q, 173q, and 175q may be made of copper alloy. The second material added to the first material may be equal to or less than approximately 20 at % of the entire content.

A diffusion metal layer 170c is disposed on surfaces of the main wiring layers 171q, 173q, and 175q. According to the exemplary embodiment of the present invention, the diffusion metal layer 170c may have a shape enclosing the main wiring layers 171q, 173q, and 175q. An material (second material) alloyed to the main wiring layers 171q, 173q, and 175q by annealing is diffused, so that the diffusion metal layer 170c may be formed.

According to the exemplary embodiment of the present invention, a metal oxide layer 177 is formed along an exposed surface of the diffusion metal layer 170c. The metal oxide layer 177 may be formed by being oxidized in a state in which the diffusion metal layer 170c is exposed to the outside. The diffusion metal layer 170c may be oxidized by nitrogen oxide plasma treatment.

According to the exemplary embodiment of the present invention, the metal oxide layer 177 covers the source electrode 173 and the drain electrode 175 while directly contacting the metal layers which are disposed on the surfaces of the source electrode 173 and the drain electrode 175, in particular, covers exposed lateral wall portions A and B of the source electrode 173 and the drain electrode 175 and exposed upper surfaces of the source electrode 173 and the drain electrode 175. In this case, the metal oxide layer 177 may not be formed on a portion of the gate insulating layer 140 which does not overlap the source electrode 173 and the drain electrode 175 and on a channel region of the semiconductor layer 151.

Hereinafter, the exposed lateral wall portion A of the source electrode 173 and the drain electrode 175 which are adjacent to the channel region of the semiconductor layer 151 will be described in detail.

Referring to FIG. 2, the projection 154 of the semiconductor layer 151 is provided with a portion which is not covered with the data line 171 and the drain electrode 175 and is exposed between the source electrode 173 and the drain electrode 175. The semiconductor layer 151 may have substantially the same plane pattern as the data line 171 and the drain electrode 175, except for the exposed portion of the projection 154. In other words, a lateral wall of the semiconductor layer 151 may be aligned like a lateral wall of the data line 171, a lateral wall of the source electrode 173, and a lateral wall of the drain electrode 175, except for the exposed portion of the projection 154.

One gate electrode 124, one source electrode 173, and one drain electrode 175 form one thin film transistor (TFT) along with the projection 154 of the semiconductor layer 151 and the channel region of the thin film transistor is formed at the projection 154 between the source electrode 173 and the drain electrode 175.

The lateral walls of the source electrode 173 and the drain electrode 175 which are adjacent to the channel region are exposed, the exposed side portions A of the source electrode 173 and the drain electrode 175 are provided with the diffusion metal layer 170c, and the exposed side portions A of the source electrode 173 and the drain electrode 175 are covered with the metal oxide layer 177.

When a subsequent process forming the passivation layer including silicon oxide in the state in which the lateral wall portions A of the source electrode 173 and the drain electrode 175 without the diffusion metal layer 170c and the metal oxide layer 177 are exposed is performed or the projection 154 of the semiconductor layer is annealed to have channel characteristics, materials such as copper included in the main wiring layers 171q, 173q, and 175q form porous oxide, and thus characteristics of the thin film transistor may be reduced. According to the exemplary embodiment of the present invention, the metal oxide layer 177 formed by the oxidization of the diffusion metal layer 170c and the diffusion metal layer 170c may prevent the materials such as copper from being oxidized.

A passivation layer 180 is formed on the source electrode 173, the drain electrode 175, and the metal oxide layer 177. The passivation layer 180 is made of inorganic insulating materials such as silicon nitride and silicon oxide, organic insulating materials, insulating materials having a low dielectric constant, and the like.

According to the exemplary embodiment of the present invention, the passivation layer 180 may include a lower passivation layer 180a and an upper passivation layer 180b. The lower passivation layer 180a may be made of silicon oxide and the upper passivation layer 180b may be made of silicon nitride. According to the exemplary embodiment of the present invention, since the semiconductor layer 151 includes oxide semiconductor, the lower passivation layer 180a which is adjacent to the semiconductor layer 151 may be made of silicon oxide. The lower passivation layer 180a is made of silicon nitride, characteristics of the thin film transistor do not appear well.

The passivation layer 180 may contact a portion which is not covered with source electrode 173 and drain electrode 175 and is exposed between the source electrode 173 and the drain electrode 175.

The passivation layer 180 is formed with a plurality of contact holes 185 through which one end of the drain electrode 175 is exposed.

A plurality of pixel electrodes 191 are formed on the passivation layer 180. The pixel electrode 191 is physically and electrically connected to the drain electrode through the contact hole 185 and is applied with a data voltage from the drain electrode 175.

The pixel electrode 191 may be made of transparent conductive materials such as ITO or IZO.

FIGS. 3 to 13 are cross-sectional views illustrating a method of manufacturing of a thin film transistor array panel according to the exemplary embodiment of the present invention. FIGS. 3 to 13 sequentially illustrate cross-sectional views taken along the cut line II-II of FIG. 11.

Figure 3:
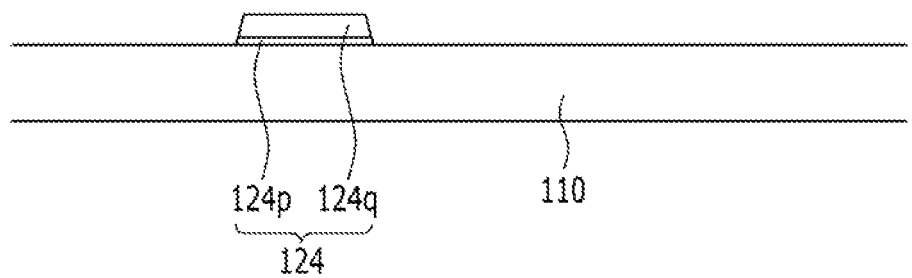
FIGS. 3 to 13 are cross-sectional views illustrating a method of manufacturing of a thin film transistor array panel according to the exemplary embodiment of the present invention.

Referring to FIG. 3, at least one of molybdenum-based metals such as molybdenum (Mo) and molybdenum alloy, chromium (Cr), chromium alloy, titanium (Ti), titanium alloy, tantalum (Ta), tantalum alloy, manganese (Mn), manganese alloy is staked on the insulating substrate 110 made of transparent glass, plastic, or the like and one selected from aluminum-based metals such as aluminum (Al) and aluminum alloy, silver-based metals such as silver (Ag) and silver alloy, and copper-based metals such as copper (Cu) and copper alloy is stacked thereon to form the double layer and then pattern the double layer, thereby forming the gate line 121 including the gate electrode 124. For example, the lower layers 121p and 124p may include titanium and the upper layers 121q and 124q may include copper or copper alloy.

In detail, after the double layer is formed, a photo resist (not shown) is stacked and patterned and then the patterned photo resist (not shown) is used as a mask to etch the lower layers 121p and 124p and the upper layers 121q and 124q together. In this case, as a usable etchant, an etchant which may etch the lower layers 121p and 124p and the upper layers 121q and 124q together may be used.

Figure 4:
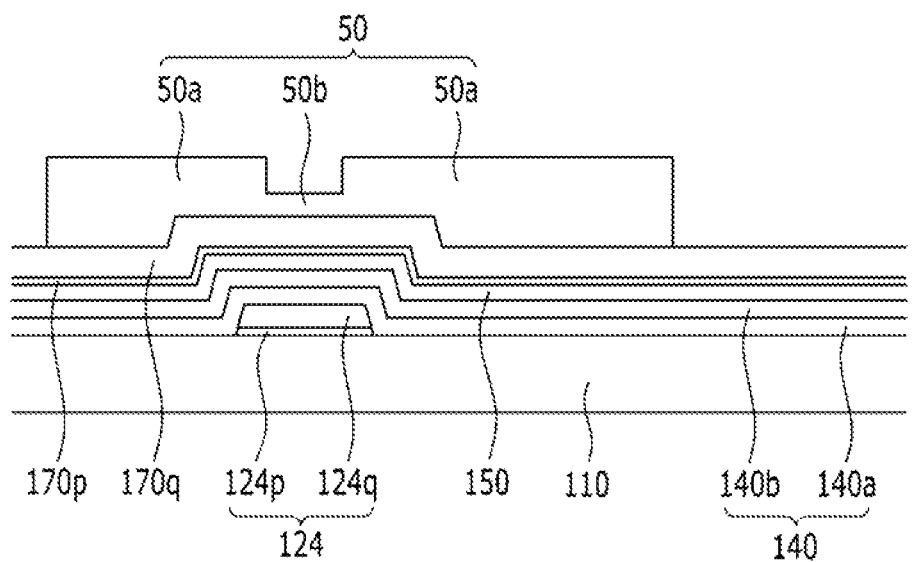

Referring to FIG. 4, the gate insulating layer 140, the oxide layer 150, the metal oxide layer 170p, and the metal layer 170q are stacked on the gate line 121 and the gate electrode 124. The first insulating layer 140a including silicon nitride is deposited on the gate insulating layer 140 and then the second insulating layer 140b including silicon oxide including silicon oxide may be deposited thereon.

The oxide layer 150 may be formed to include at least one of zinc (Zn), indium (In), tin (Sn), gallium (Ga), and hafnium (Hf), the metal oxide layer 170p may be formed to include one of indium-zinc oxide, gallium-zinc oxide, and aluminum-zinc oxide, and the metal layer 170q may be formed to include copper alloy. The material included in copper may include at least one of Mn, Mg, Al, Mo, W, Ti, Ga, In, Ni, La, Nd, Sn, Ag, Cr, Zr, Zn, and Fe.

The photo resist is formed thereon and then is patterned to form a first photo resist pattern 50. The first photo resist pattern 50 has a thick first region 50a and a relatively thinner second region 50b. A difference in thickness of the first photo resist pattern 50 may be formed by controlling an irradiated amount of light using the mask or using a reflow method. In the case of controlling the amount of light, a slit pattern, a lattice pattern, or a translucent layer may be formed. The second region 50b having a thin thickness corresponds to a position at which the channel region of the thin film transistor is formed.

Figure 5:
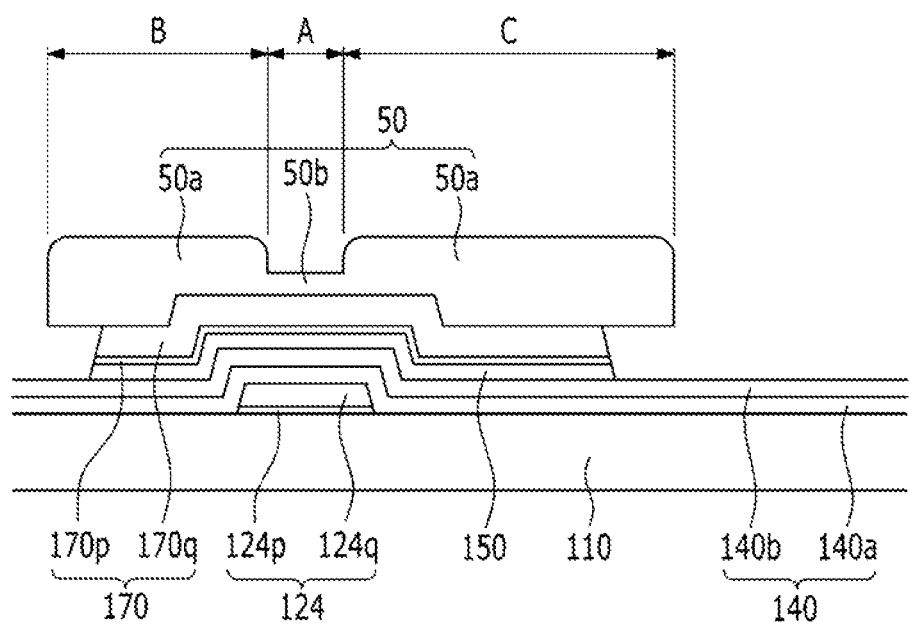

Referring to FIG. 5, the first photo resist pattern 50 is used as the mask and an etchant which may etch the metal oxide layer 170p and the metal layer 170q together is used to etch the metal oxide layer 170p and the metal layer 170q. The etchant used herein may be the same as the etchant used at the time of etching the lower layers 121p and 124p and the upper layers 121q and 124q of the gate line 121.

As illustrated in FIG. 5, when the metal oxide layer 170p and the metal layer 170q are etched, the sides of the metal oxide layer 170p and the metal layer 170q which are covered with the first photo resist pattern 50 are etched with the etchant, and as a result, as illustrated in FIG. 5, a boundary line between a first metal layer 170p and a second metal layer 170r is disposed in regions A, B, and C in which the first photo resist pattern 50 is formed.

In this case, the etchant which etches the metal oxide layer 170p and the metal layer 170q does not etch the gate insulating layer 140 and the oxide layer 150.

In addition, the first photo resist pattern 50 uses the mask to etch the oxide layer 150.

Figure 6:
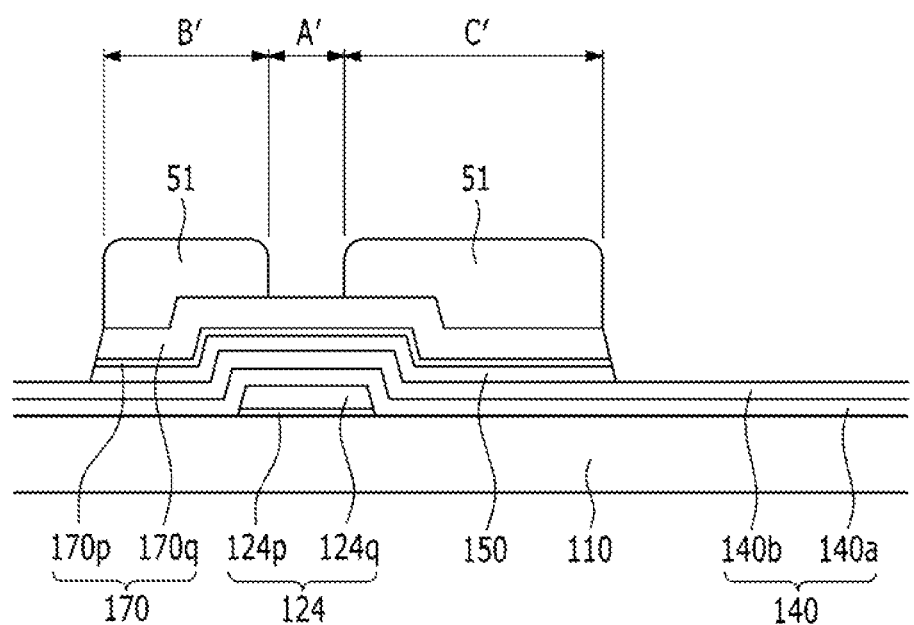

Referring to FIG. 6, the second portion 50b having a thin thickness in FIG. 5 is removed with an etch back. In this case, the first portion 50a is etched together and thus a width and a height thereof are reduced, and as a result, the first portion 50a becomes a second photo resist of FIG. 6. The second photo resist 51 is formed in narrower regions A', B', and C' narrower than the regions A, B, and C in which the first photo resist in FIG. 5 is formed.

Figure 7:
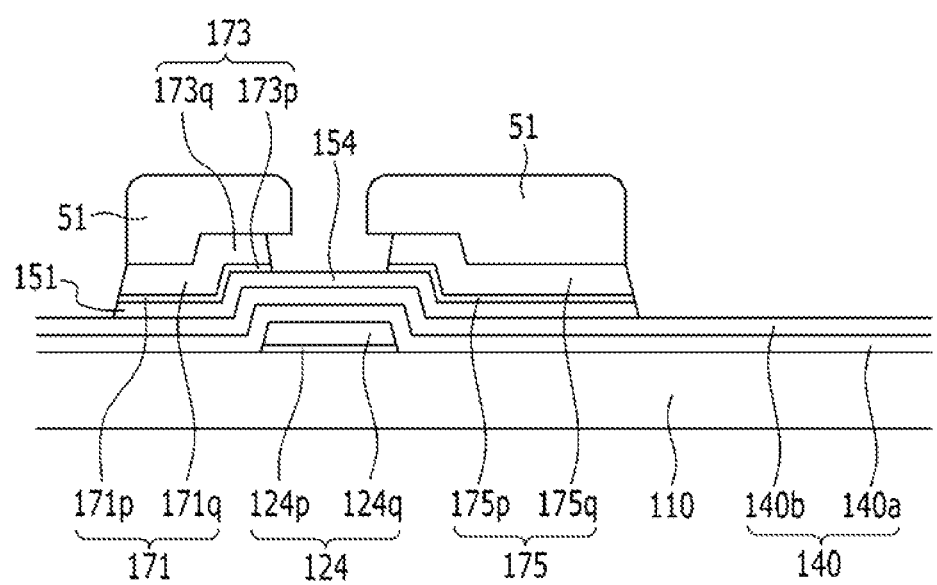

Referring to FIG. 7, the second photo resist 51 is used as the mask and the etchant is used to etch the metal oxide layer 170p and the metal layer 170q.

In this case, the metal oxide layer 170p and the metal layer 170q are separated from each other to form the data lines 171p and 171q, the source electrodes 173p and 173q, and the drain electrodes 175p and 175q of the double layer. Further, the semiconductor layer 151 including the projection 154 which forms the channel of the thin film transistor while the upper surface of the oxide layer 150 is exposed is formed.

As such, when the photo resists having different thicknesses are used, the semiconductor layers 151 and 154 having substantially the same plane pattern as the barrier layers 171p, 173p, and 175p and the main wiring layers 171q, 173q, and 175q of the data line 171, the source electrode 173, and the drain electrode 175 are formed. In detail, the lateral walls of the semiconductor layers 151 and 154 are aligned to be substantially same as the lateral wall of the data line 171, the lateral wall of the source electrode 173, and the lateral wall of the drain electrode 175, except the exposed portion between the drain electrode 175 and the source electrode 173.

Figure 8:
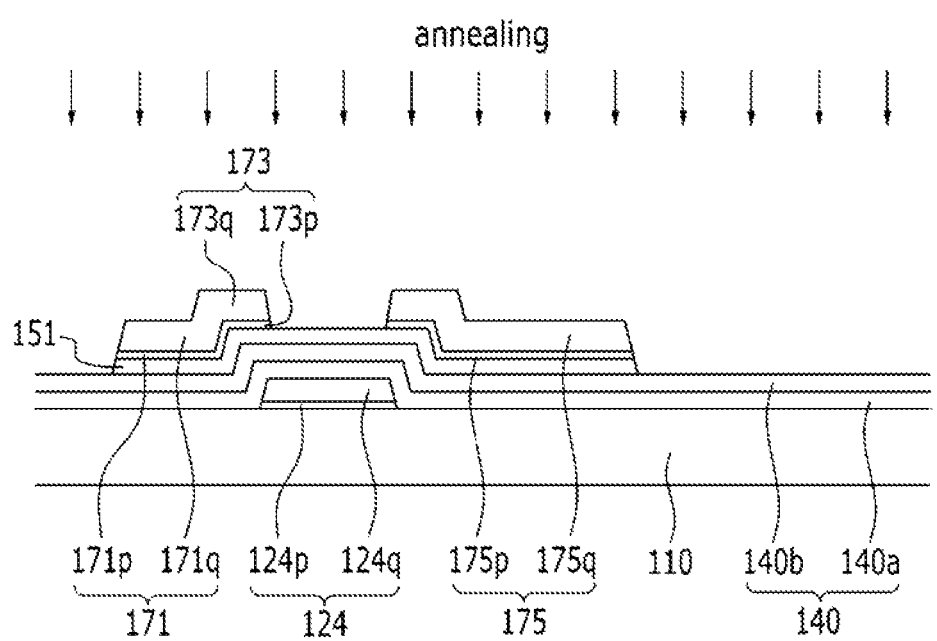

Next, referring to FIG. 8, ashing is performed to remove the photo resist and then annealing may be performed to form the diffusion metal layer on the surfaces of the source electrode 173 and the drain electrode 175.

Figure 9:
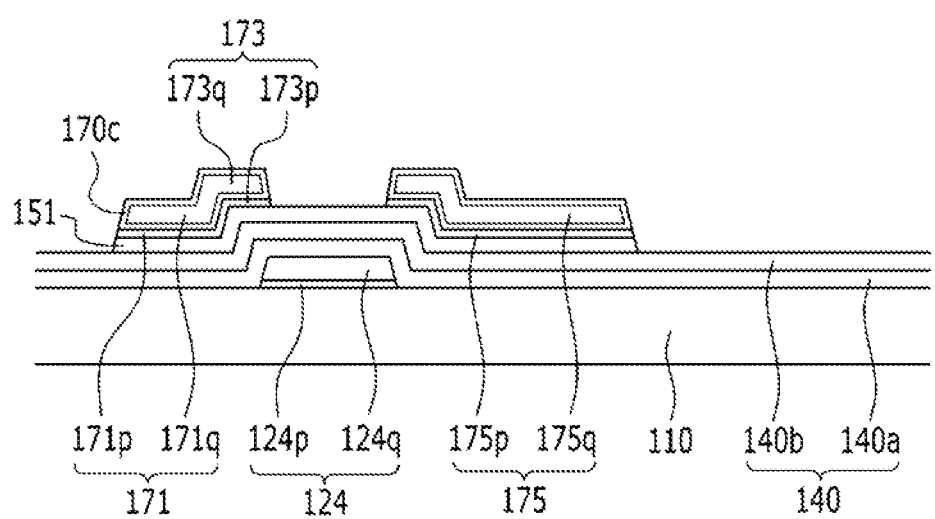

Referring to FIG. 9, the second material (alloyed material) included in the source part 173q of the main wiring layer and the drain part 175q of the main wiring layer are diffused to an edge during the annealing. In this case, copper is mainly distributed at the centers of the source part 173q of the main wiring layer and the drain part 175q of the main wiring layer and the diffusion metal layer 170c including the second material is formed along the surfaces of the source part 173q of the main wiring layer and the drain part 175q of the main wiring layer.

Figure 10:
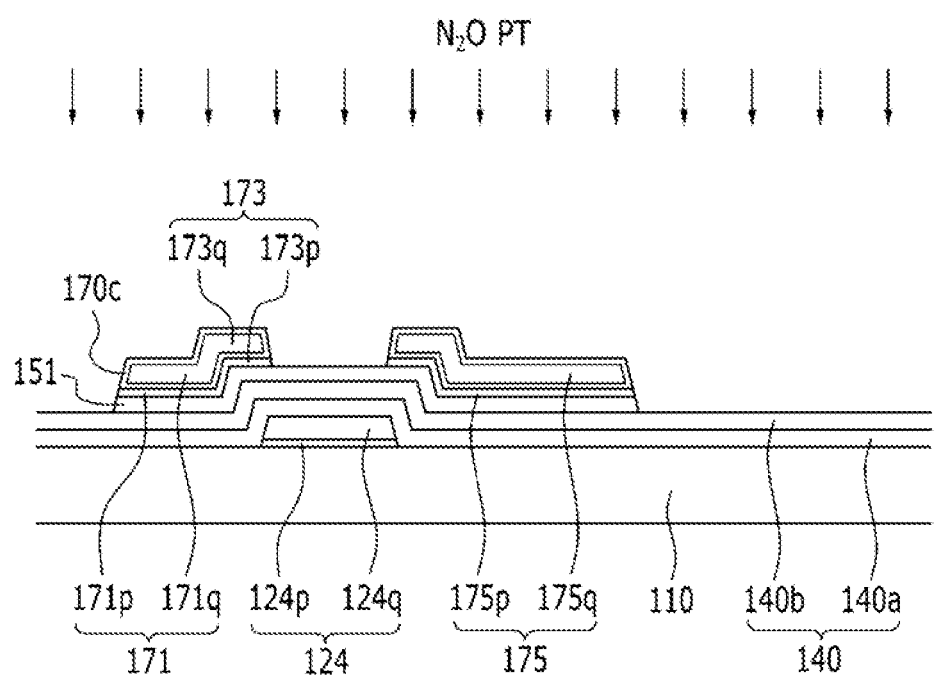

Referring to FIG. 10, the surface of the diffusion metal layer 170c may be subjected to N2O (nitrous oxide) plasma treatment to improve characteristics of the thin film transistor.

Figure 11:
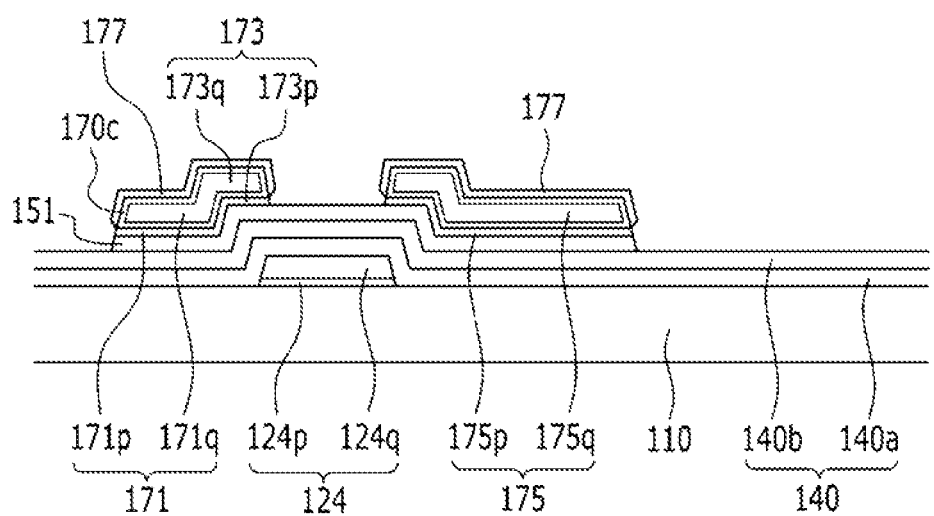

Referring to FIG. 11, a portion of the diffusion metal layer 170c which is disposed on the surfaces of the source part 173q of the main wiring layer and the drain part 715q of the main wiring layer is oxidized and thus the metal oxide layer 177 is formed along the surfaces thereof. The metal oxide layer 177 may be formed on the upper surface and the lateral wall of the diffusion metal layer 170c.

Figure 12:
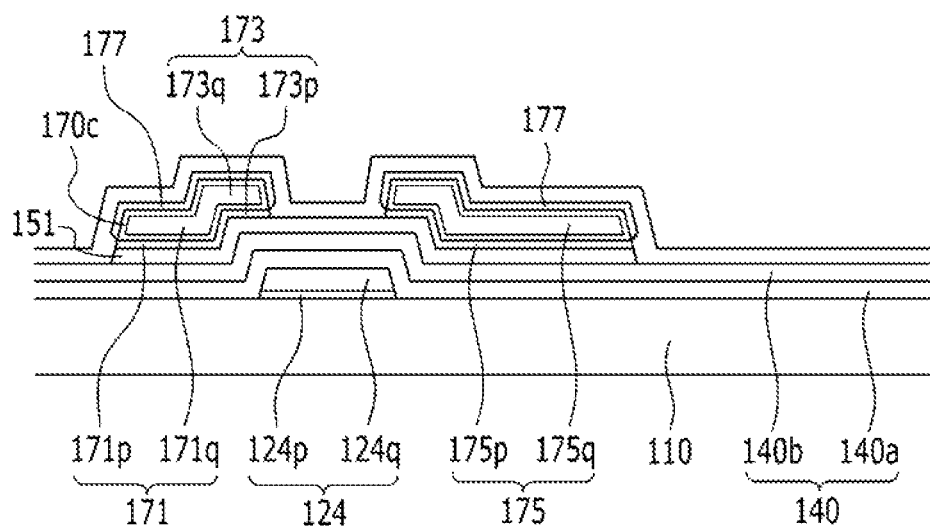
Figure 13:
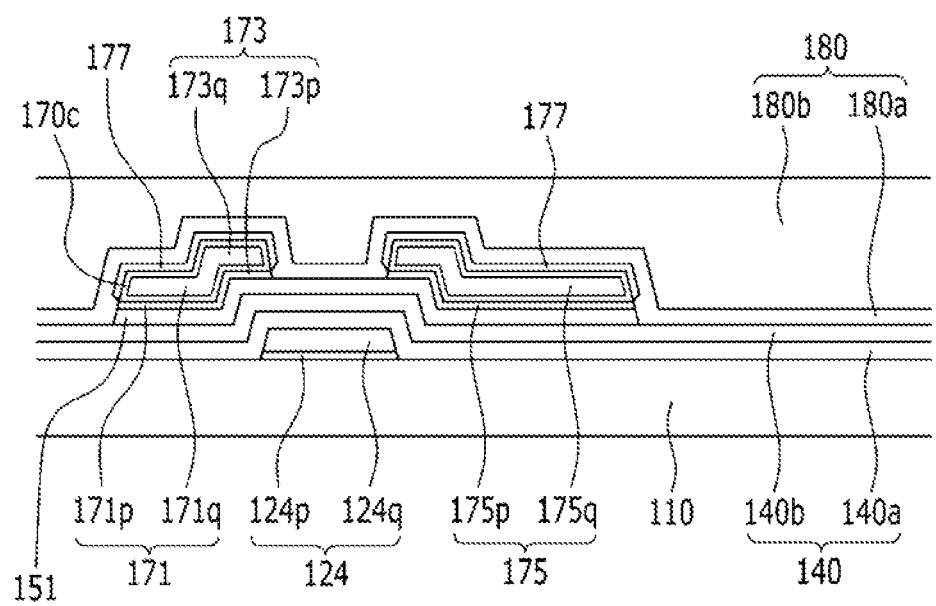

Referring to FIGS. 12 and 13, the passivation layer 180 is formed on the metal oxide layer 177, the gate insulating layer 140, and the projection 154 of the semiconductor layer exposed between the source electrode 173 and the drain electrode 175. The passivation layer 180 forms the lower passivation layer 180a including silicon oxide (SiOx) and the upper passivation layer 180b including silicon nitride (SiNx) may be formed on the lower passivation layer 180a.

The thin film transistor array panel as illustrated in FIG. 2 may be formed by forming the contact hole 185 through which a portion of the drain electrode 175 is exposed by patterning the passivation layer 180 and forming the pixel electrode 191 on the passivation layer 180. In this case, the pixel electrode 191 is formed to be physically connected to the drain electrode 175 through the contact hole 185.

Figure 14:
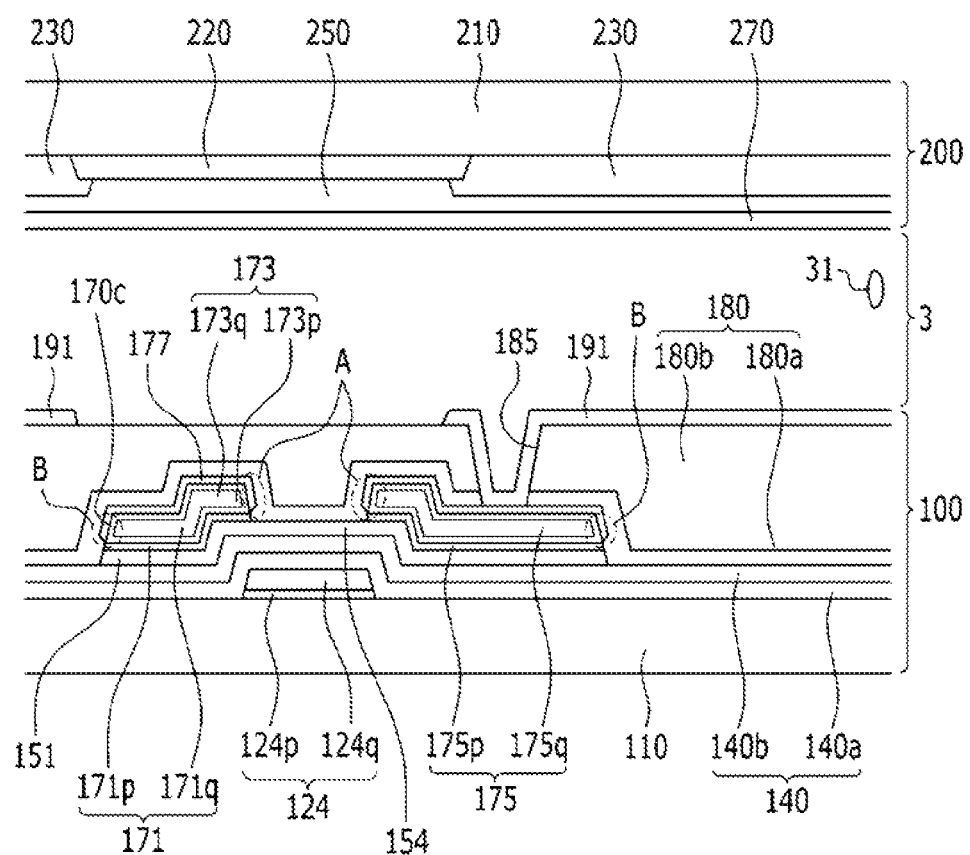
FIG. 14 is a cross-sectional view illustrating a liquid display device according to an exemplary embodiment of the present invention.

FIG. 14 is a cross-sectional view illustrating a liquid display device according to an exemplary embodiment of the present invention.

Referring to FIG. 14, the thin film transistor array panel 100 and the counter display panel 200 face each other and the liquid crystal layer 3 is disposed therebetween.

The second substrate 210 is disposed at a position facing the first substrate 110. The second substrate 210 may be the insulating substrate made of transparent glass, plastic, or the like. The light blocking member 220 is formed on the second insulating substrate 210. The light blocking member 220 is called a black matrix and prevents light leakage.

A plurality of color filters 230 are formed on the second substrate 210 and the light blocking member 220. The color filter 230 is mainly present in the region which is enclosed with the light blocking member 220 and may vertically extend along a column of the pixel electrode 191. Each color filter 230 may display one of primary colors such as three primary colors of red, green, and blue. However, the color filters 230 and 230' may also display one of cyan, magenta, yellow, white-based colors, without being limited to the three primary colors of red, green, and blue.

Although the case in which the light blocking member 220 and the color filter 230 are formed on the counter display panel 200 is described above, but at least one of the light blocking member 220 and the color filter 230 may also be formed on the thin film transistor array panel 100.

The overcoat 250 is formed on the color filter 230 and the light blocking member 220. The overcoat 250 may be made of an insulating material and prevents the color filter 230 from being exposed and provides a flat surface. The overcoat 250 may be omitted.

A common electrode 270 is formed on the overcoat 250.

The pixel electrode 191 to which the data voltage is applied generates an electric field along with the common electrode 270 to which a common voltage is applied to determine an alignment of liquid crystal molecules 31 of the liquid crystal layer 3 between the two electrodes. The pixel electrode 191 and the common electrode 270 form a capacitor and thus maintain an applied voltage even after the thin film transistor is turned off.

The pixel electrode 191 may overlap a storage electrode line (not illustrated) to form a storage capacitor, and thus voltage maintaining capability of a liquid crystal capacitor may be strengthened.

The content of the exemplary embodiment described with reference to FIG. 2 may be applied to the description of the thin film transistor array panel 100.

Although the case in which the thin film transistor array panel according to the exemplary embodiment of the present invention is applied to the liquid crystal display is described, the exemplary embodiment of the present invention may be widely applied to display devices which perform a switching operation using the organic light emitting diode display and other thin film transistors.

Figure 15:
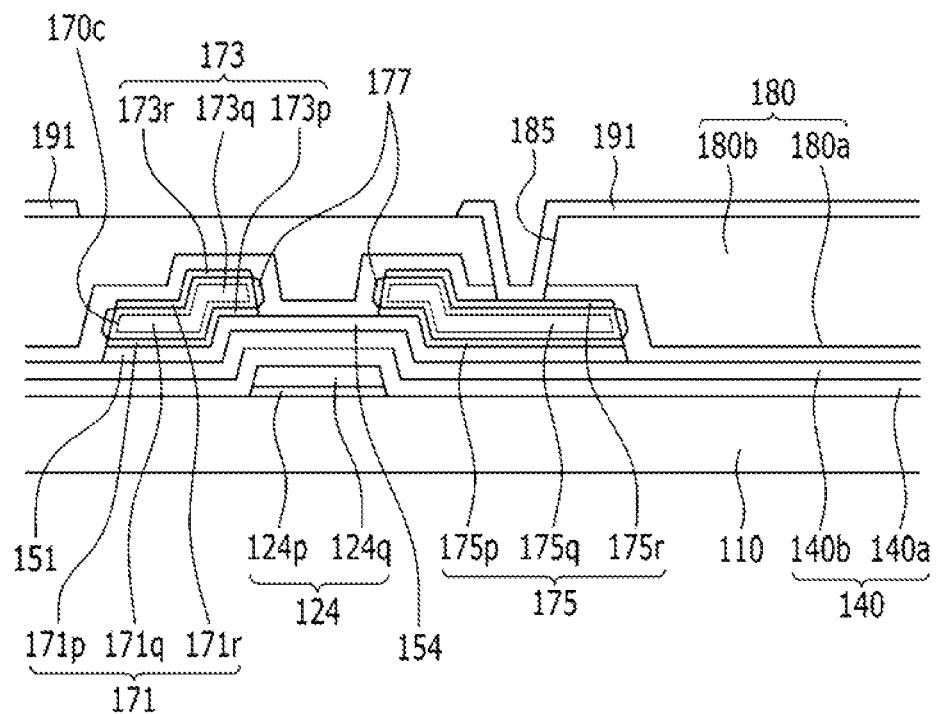
FIG. 15 is a cross-sectional view taken along the line II-II of FIG. 1 to represent the thin film transistor array panel according to the exemplary embodiment of the present invention.

FIG. 15 is a cross-sectional view taken along the line II-II of FIG. 1 to represent the thin film transistor array panel according to the exemplary embodiment of the present invention.

The exemplary embodiment of the present invention described with reference to FIG. 15 is substantially the same as the exemplary embodiment described with reference to FIG. 2. Hereinafter, portions different from the exemplary embodiment of the present invention of FIG. 2 will be described.

Referring to FIG. 15, the data line 171, the source electrode 173, and the drain electrode 175 further include capping layers 171r, 173r, and 175r which are disposed on the main wiring layers 171q, 173q, and 175q. The capping layers 171r, 173r, and 175r include metal oxide. For example, the capping layers 171r, 173r, and 175r may be made of one of indium-zinc oxide, gallium-zinc oxide, and aluminum-zinc oxide and among those, may be preferably made of gallium-zinc oxide. According to the exemplary embodiment of the present invention, the metal oxide layer 177 may be formed at the exposed lateral wall portions of the main wiring layers 171, 173q, and 175r between the barrier layers 171p, 173p, and 175p and the capping layers 171r, 173r, and 175r.

Except for the difference from the foregoing description, the content described with reference to FIG. 2 may be applied to all of the exemplary embodiments of the present invention.

FIGS. 16 to 25 are cross-sectional views illustrating a method of manufacturing a thin film transistor array panel according to the exemplary embodiment of the present invention. FIGS. 16 to 25 sequentially illustrate cross-sectional views taken along the cut line II-II of FIG. 1.

Figure 16:
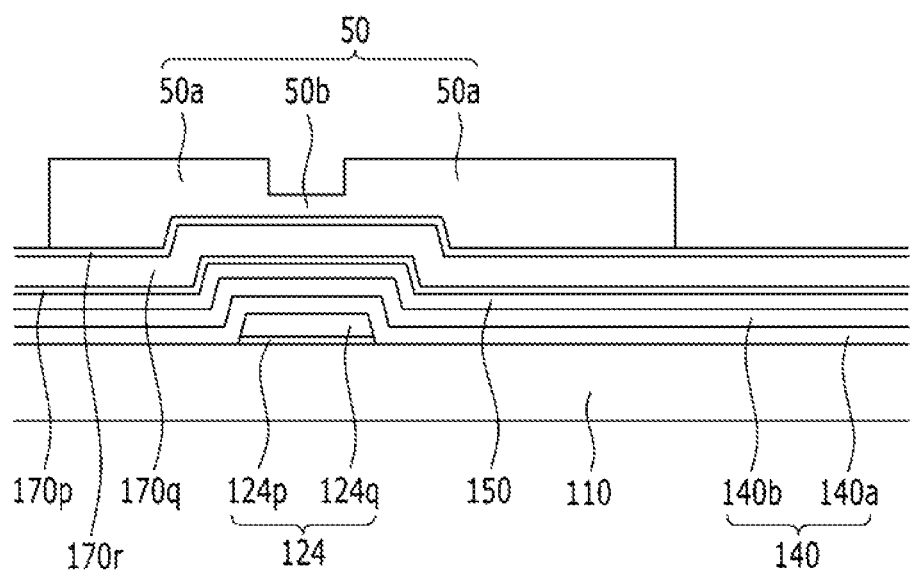
FIGS. 16 to 25 are cross-sectional views illustrating a method of manufacturing a thin film transistor array panel according to the exemplary embodiment of the present invention.
Figure 17:
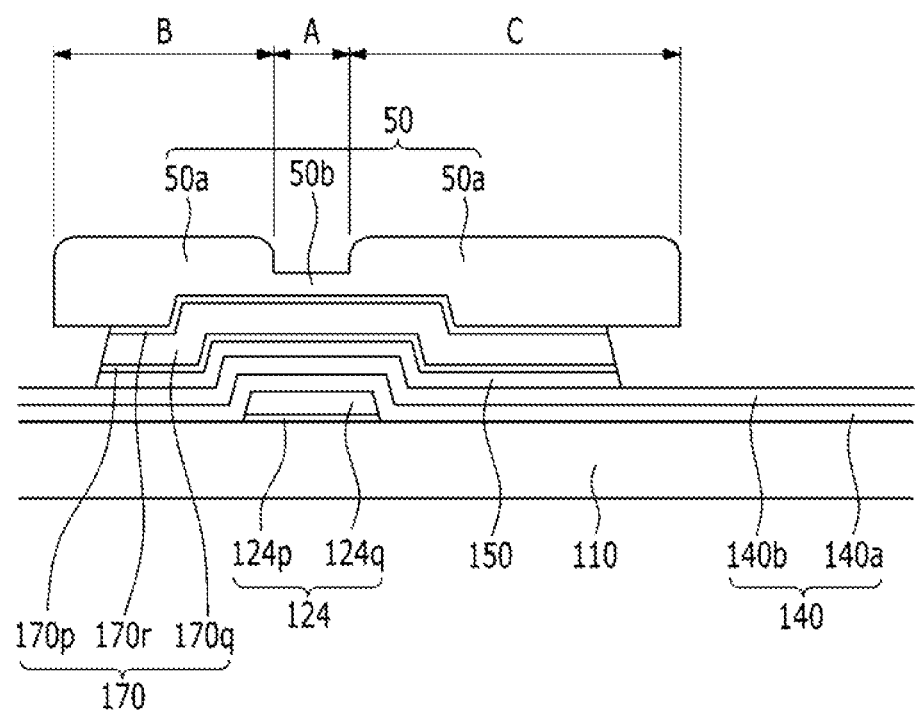
Figure 18:
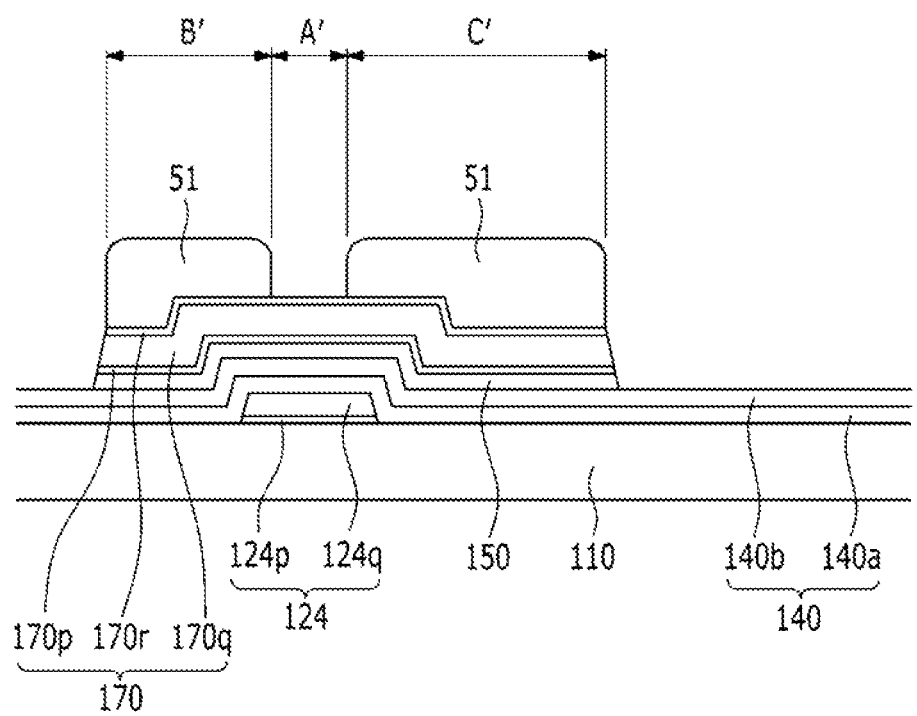
Figure 19:
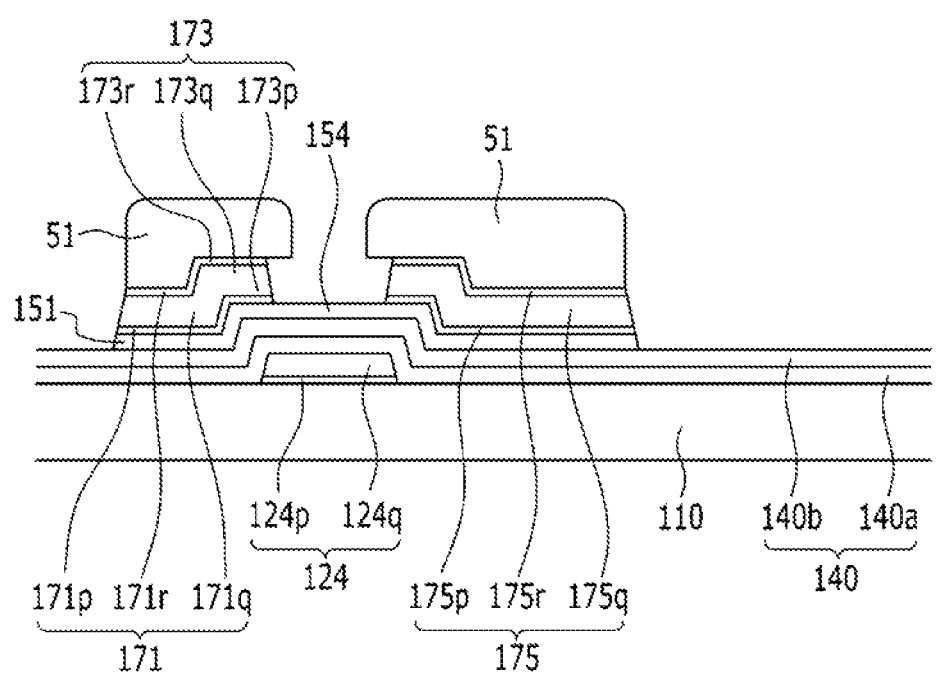

Referring to FIGS. 16 to 21, the method for manufacturing a thin film transistor array panel according to the exemplary embodiment of the present invention is substantially the same as the exemplary embodiment of the present invention described with reference to FIGS. 4 to 9. However, the method for manufacturing a thin film transistor array panel according to the exemplary embodiment of the present invention may additionally form the metal oxide layer 170r on the metal layer 170q as illustrated in FIG. 16. In the subsequent process, the metal oxide layer 170r is subjected to a patterning process along with the metal layer 170q and the metal oxide layer 170p which are formed thereunder to form the capping layers 171r, 173r, and 175r on the main wiring layers 171q, 173q, and 175q as illustrated in FIG. 19.

Figure 20:
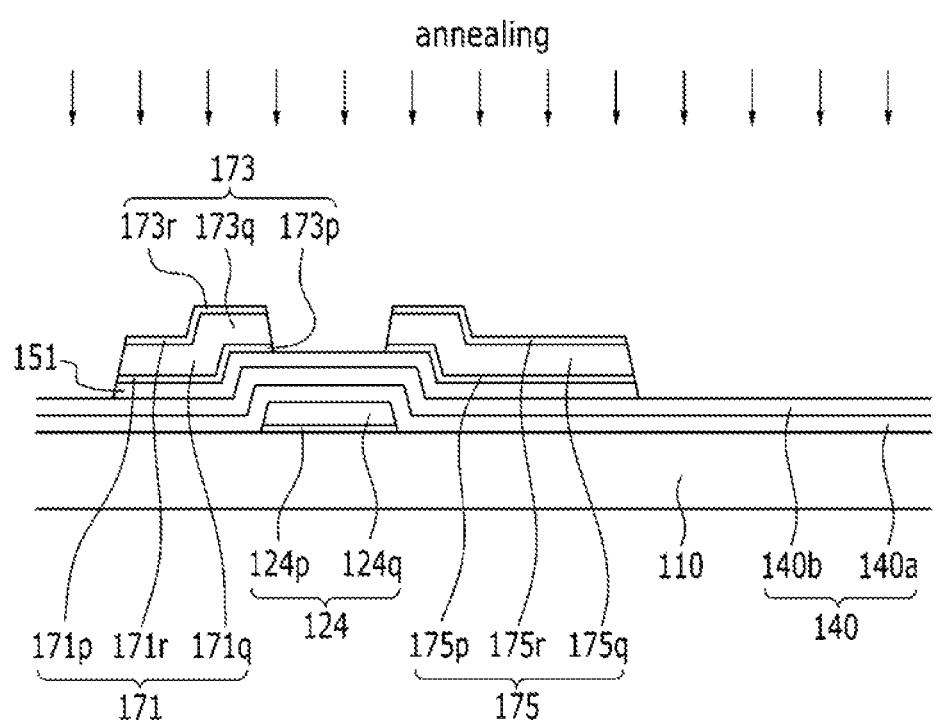

Referring to FIG. 20, the ashing is performed to remove the photo resist and then the annealing may be performed to form the diffusion metal layer on the surfaces of the source electrode 173 and the drain electrode 175.

Figure 21:
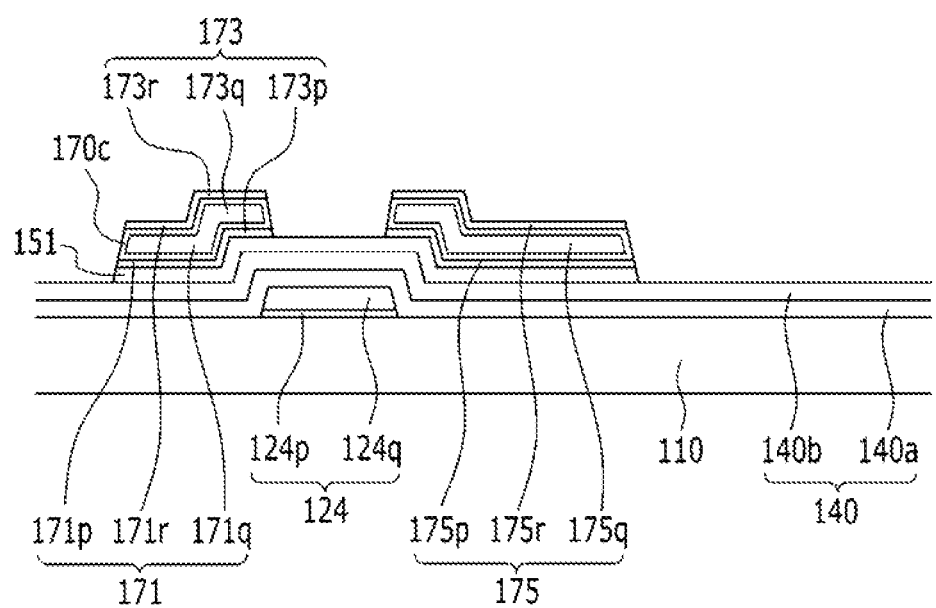

Referring to FIG. 21, the second material (alloyed material) included in the source part 173q of the main wiring layer and the drain part 175q of the main wiring layer are diffused to an edge during the annealing. In this case, copper is mainly distributed at the centers of the source part 173q of the main wiring layer and the drain part 175q of the main wiring layer and the diffusion metal layer 170c including the second material is formed along the surfaces of the source part 173q of the main wiring layer and the drain part 175q of the main wiring surface.

Figure 22:
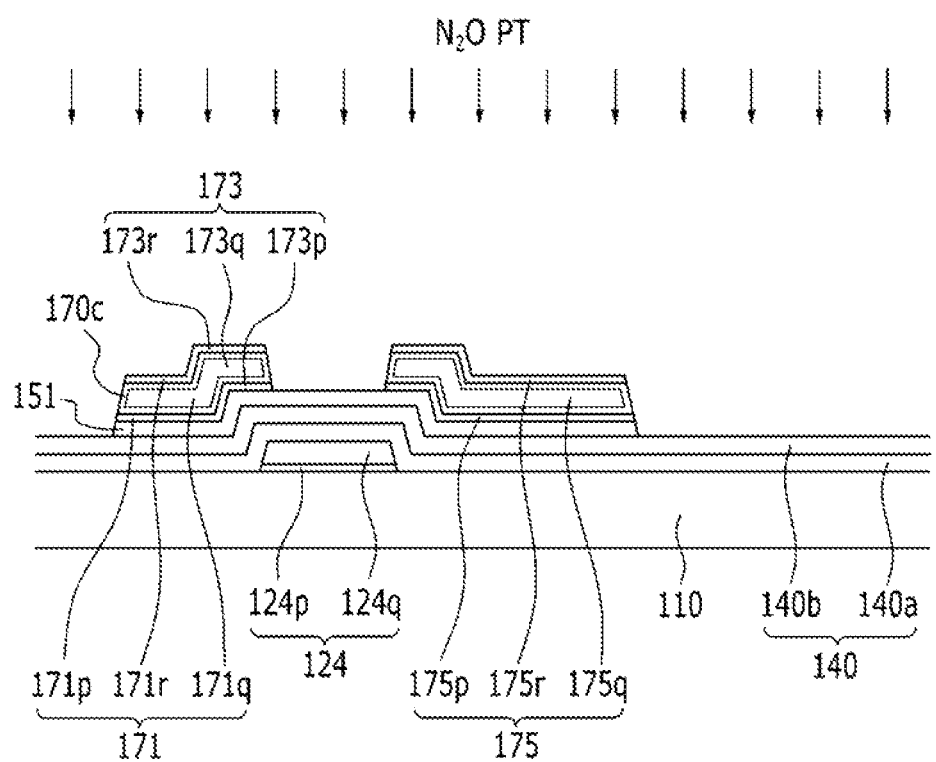

Referring to FIG. 22, the surface of the diffusion metal layer 170c may be subjected to N2O (nitrous oxide) plasma treatment to improve characteristics of the thin film transistor.

Figure 23:
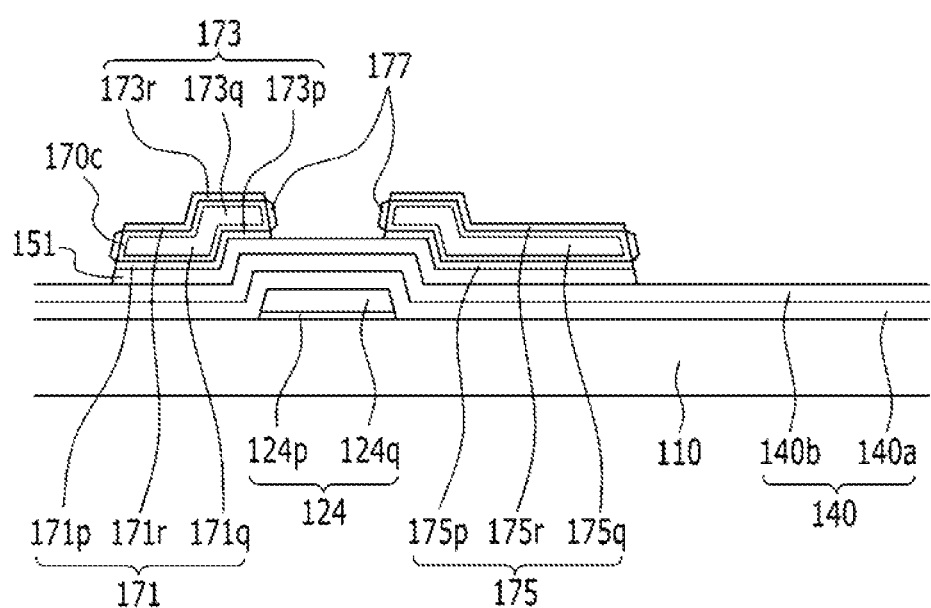

Referring to FIG. 23, a portion of the diffusion metal layer 170c which is disposed on the surfaces of the source part 173q of the main wiring layer and the drain part 715q of the main wiring layer is oxidized and thus the metal oxide layer 177 is formed along the surfaces thereof. The metal oxide layer 177 may be formed on the lateral wall of the diffusion metal layer 170c.

Figure 24:
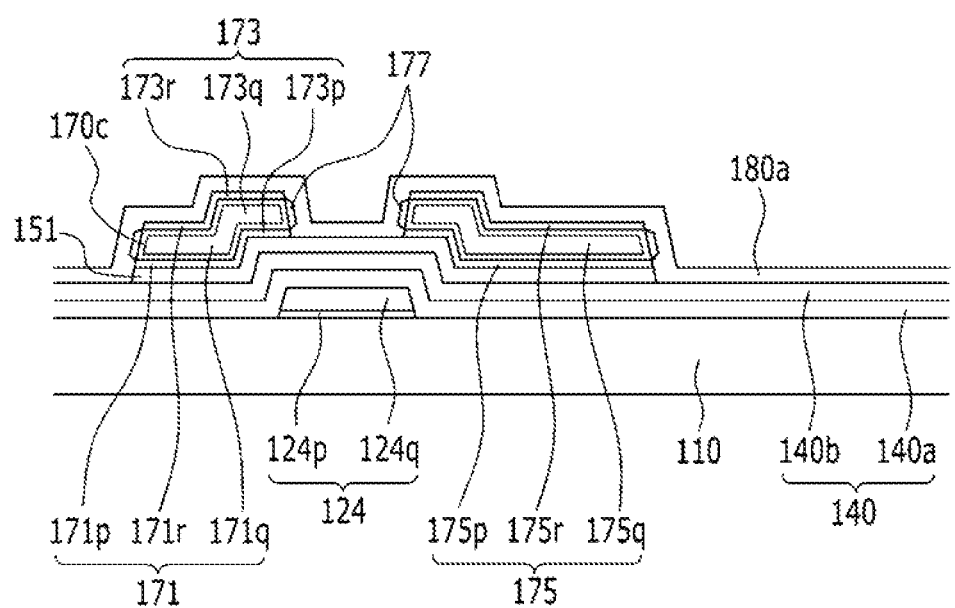
Figure 25:
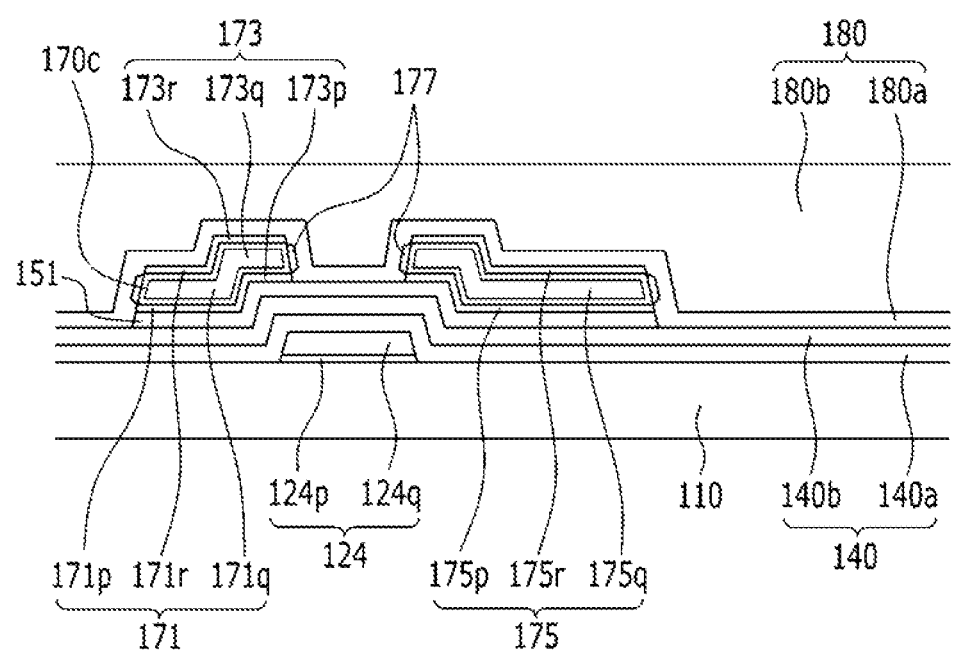

Referring to FIGS. 24 and 25, the passivation layer 180 is formed on the metal oxide layer 177, the gate insulating layer 140, the capping layers 171r, 173r, and 175r, and the projection 154 of the semiconductor layer exposed between the source electrode 173 and the drain electrode 175. The passivation layer 180 forms the lower passivation layer 180a including silicon oxide (SiOx) and the upper passivation layer 180b including silicon nitride (SiNx) may be formed on the lower passivation layer 180a.

The thin film transistor array panel as illustrated in FIG. 15 may be formed by forming the contact hole 185 through which a portion of the drain electrode 175 is exposed by patterning the passivation layer 180 and forming the pixel electrode 191 on the passivation layer 180. In this case, the pixel electrode 191 is formed to be physically connected to the drain electrode 175 through the contact hole 185.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a substrate;
   a gate electrode disposed on the substrate;
   a semiconductor layer disposed on the substrate;
   a gate insulating layer disposed between the gate electrode and the semiconductor layer;
   a source electrode disposed on the semiconductor layer and a drain electrode facing the source electrode;
   a metal oxide layer covering the source electrode and the drain electrode;
   a diffusion metal layer disposed between the source electrode and the metal oxide layer and between the drain electrode and the metal oxide layer; and
   a passivation layer covering the source electrode, the drain electrode, and the metal oxide layer,
   wherein the source electrode and the drain electrode include a first material and a second material which is added to the first material, and
   wherein metal included in the metal oxide layer is the same as the second material.

2. The thin film transistor array panel of claim 1, wherein the metal oxide layer contacts lateral walls of the diffusion metal layer.

3. The thin film transistor array panel of claim 2, wherein:
the source electrode and the drain electrode include copper or copper alloy.

4. The thin film transistor array panel of claim 3, wherein:
the second material includes at least one of Mn, Mg, Al, Mo, W, Ti, Ga, In, Ni, La, Nd, Sn, Ag, Cr, Zr, Zn, and Fe.

5. The thin film transistor array panel of claim 4, further comprising:
barrier layers disposed under the source electrode and the drain electrode, the barrier layer including metal oxide.

6. The thin film transistor array panel of claim 5, wherein:
the barrier layer includes one of indium-zinc oxide (IZO), gallium-zinc oxide (GZO), and aluminum-zinc oxide (AZO).

7. The thin film transistor array panel of claim 1, wherein:
the metal oxide layer covers upper surfaces and lateral walls of the source electrode and the drain electrode, respectively.

8. The thin film transistor array panel of claim 7, wherein:
the passivation layer contacts the upper surface and the lateral wall of the metal oxide layer.

9. The thin film transistor array panel of claim 1, further comprising:
barrier layers disposed under the source electrode and the drain electrode; and
capping layers disposed over the source electrode and the drain electrode, the barrier layer and the capping layer including metal oxide.

10. The thin film transistor array panel of claim 9, wherein:
lateral walls of the source electrode and the drain electrode, respectively, which are adjacent to a channel region of the semiconductor layer are exposed and the exposed lateral wall of the source electrode and the exposed lateral wall of the drain electrode are covered with the metal oxide layer.

11. The thin film transistor array panel of claim 1, wherein:
the semiconductor layer includes oxide semiconductor.

12. The thin film transistor array panel of claim 1, wherein:
the lateral wall of the semiconductor layer is aligned like the lateral walls of the source electrode and the drain electrode, except for the channel region.

13. The thin film transistor array panel of claim 1, wherein:
the diffusion metal layer includes the alloyed material in the source electrode and the drain electrode.

* * * * *